(12) United States Patent
Chen et al.

(10) Patent No.: US 10,219,399 B2
(45) Date of Patent: Feb. 26, 2019

(54) COMPONENT QUICK RELEASE LATCH ASSEMBLY

(71) Applicant: Quanta Computer Inc., Taoyuan (TW)

(72) Inventors: Chao-Jung Chen, Taoyuan (TW); Yaw-Tzorng Tsorng, Taoyuan (TW); Chen-Chien Kuo, Taoyuan (TW); Wei-Lin Tsui, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 477 days.

(21) Appl. No.: 15/044,778

(22) Filed: Feb. 16, 2016

(65) Prior Publication Data

US 2017/0042055 A1 Feb. 9, 2017

Related U.S. Application Data

(60) Provisional application No. 62/202,511, filed on Aug. 7, 2015.

(51) Int. Cl.
  *H05K 7/14* (2006.01)
  *G06F 1/18* (2006.01)

(52) U.S. Cl.
  CPC .......... *H05K 7/1487* (2013.01); *G06F 1/183* (2013.01)

(58) Field of Classification Search
  CPC ...... H05K 7/14; H05K 7/1488; H05K 7/1401; Y10T 403/59; Y10T 403/591; Y10T 403/595; Y10T 403/60; Y10T 403/602
  See application file for complete search history.

(56) References Cited

U.S. PATENT DOCUMENTS 2,132,806 A * 10/1938 Ruegg ...................... E05C 3/12
  292/204
7,549,243 B1 * 6/2009 Gilles .................... A01D 34/64
  37/468

(Continued)

FOREIGN PATENT DOCUMENTS

CN  102378716 A  3/2012
TW  M440035 U  11/2012

OTHER PUBLICATIONS

Chinese Office Action for Application No. 201610267965.6, dated Dec. 29, 2017, w/ First Office Action Summary.

(Continued)

*Primary Examiner* — Jonathan P Masinick
(74) *Attorney, Agent, or Firm* — Nixon Peabody LLP; Eduardo J. Quiñones; Zhou Lu

(57) ABSTRACT

Latch mechanism having a latch slide having a receiving portion and configured to couple a component with a server chassis. A latch ramp disposed on the latch slide at a first end of the receiving portion, a release ramp disposed on the latch slide at a second end of the receiving portion, and a biasing element biasing the latch slide in a latched position. The latch ramp configured to draw the pin into the receiving portion and the release ramp configured to draw the pin away from the receiving portion. When the latch slide transitions to the latched position, the pin is received in the receiving portion and engages the latch ramp, thereby sliding the latch slide and compressing the biasing element. When the latch slide transitions to the unlatched position, the biasing member is compressed causing the pin to engage the release ramp and translate the component.

16 Claims, 7 Drawing Sheets

(56) References Cited

U.S. PATENT DOCUMENTS

| | | | | |
|---|---|---|---|---|
| 8,915,557 B2* | 12/2014 | Doglio | ................ | H05K 7/1489 |
| | | | | 312/222 |
| 2014/0312755 A1* | 10/2014 | Nuckolls | .............. | A47B 88/463 |
| | | | | 312/333 |
| 2015/0164217 A1* | 6/2015 | Samikkannu | ........ | A47B 3/0815 |
| | | | | 108/122 |

OTHER PUBLICATIONS

Taiwanese Office Action for Application No. 105110858, dated Sep. 28, 2017, w/ First Office Action Summary.

* cited by examiner

COMPONENT QUICK RELEASE LATCH ASSEMBLY

CROSS REFERENCE TO RELATED APPLICATIONS

This application claims priority to U.S. Provisional Application No. 62/202,511 entitled "PCBA latch mechanism with lock and ejector function", filed on Aug. 7, 2015, the contents of which are expressly incorporated by reference in its entirety.

FIELD OF THE INVENTION

The subject matter herein generally relates to a latch assembly. More specifically, the subject matter herein relates to a latch assembly configured to assist in installation and removal of a component from a component receiving module.

BACKGROUND

Electronic devices rely on components coupled to component receiving modules to operate. These components include hard drives, data cards, network cards, fans, video cards, or the like. These components fail and/or require replacement during the life of the electronic device. The coupling and decoupling of components from component receiving modules often requires a significant separation force often in a confined or tight environment. This significant separate force can damage to the component, component receiving module, or the electronic device during decoupling or cause injury to a technician.

BRIEF DESCRIPTION OF THE DRAWINGS

Implementations of the present technology will now be described, by way of example only, with reference to the attached figures, wherein.

DETAILED DESCRIPTION

Figure 1:
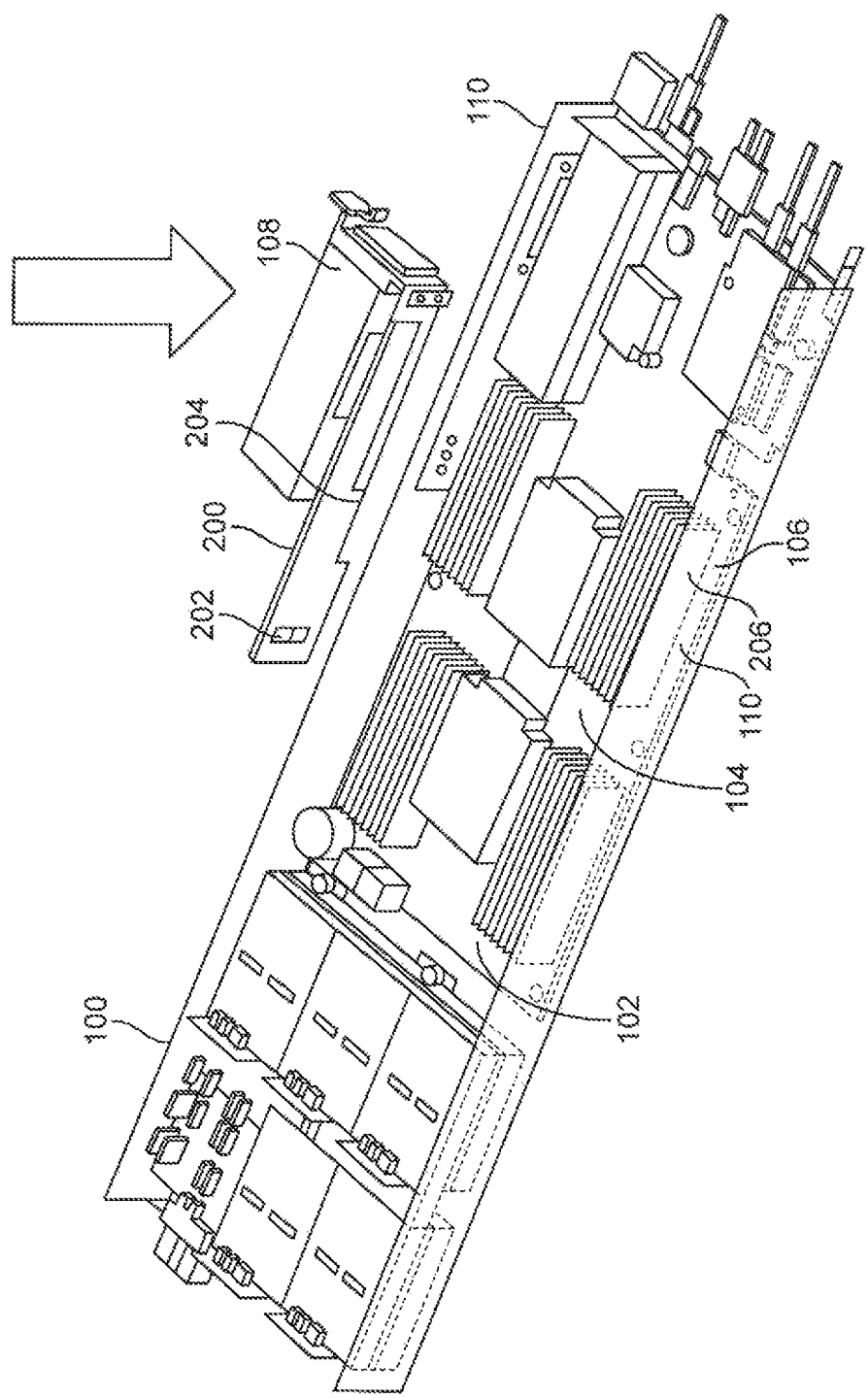
FIG. 1 illustrates an exploded view of an example embodiment of an electronic device and a component having a latch assembly.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Electronic devices have become common place in everyday life, and electronic devices rely on components coupled to component receiving modules. As those components need to be replaced, decoupling the component from the component receiving module often requires significant force in a compact environment. The component receiving module can be disposed on a printed circuit board assembly (PCBA) within a server or other electronic device. While the present disclosure is described with respect to a server chassis, it can be appreciated that any electronic device and component can be implemented with the latch assembly of the present disclosure.

The present disclosure is focused on increasing the ease of removing and installing components within component receiving modules of electronic devices. Electronic devices have a plurality of components coupled to component receiving modules. Each component can be coupled with a latch mechanism for locking and releasing the component with a component receiving module. A latch mechanism having a latch slide configured to couple a component with a server chassis. The latch slide transitionable between a latched position and an unlatched position and the latch slide having a receiving portion configured to receive a pin. A latch ramp disposed on the latch slide at a first end of the receiving portion and a release ramp disposed on the latch slide at a second end of the receiving portion. A biasing element configured to bias the latch slide in the latched position. The latch ramp is configured to draw the pin into the receiving portion and the release ramp is configured to draw the pin away from the receiving portion. When the latch slide transitions from the unlatched position to the latched position, the latch slide receives the pin in the receiving portion and the pin engages the latch ramp thereby sliding the latch slide and compressing the biasing element. When the latch slide transitions from the latched position to the unlatched position, the biasing member is compressed and the pin engages the release ramp translating the component in a vertical direction.

The component can be a Peripheral Component Interconnect Express (PCI-e) card received in a PCI-e interface of an electronic device. The electronic device can be a server, computer, laptop, or other electronic device. While the exemplary embodiments illustrated herein utilizes a PCI-e card and interface, the present disclosure relates to any component and corresponding component interface, such as Peripheral Component Interconnect (PCI), ExpressCard, Serial AT Attachment (SATA) Express and any component such as network cards, fans, motherboards, processors, memory cards, or other electronic device components.

While the illustrated is drawn to a component coupling to the latch slide and the pin to an electronic device, or vice versa, it is within the present disclosure to implement the latch assembly with any combination of the features discussed below, specifically with respect to the position of the latch slide and pin.

FIG. 1 illustrates an example embodiment of a server chassis 100. The server chassis 100 has a printed circuit board assembly (PCBA) 102 disposed therein. The PCBA 102 can have one or more printed circuit boards (PCB) 104 coupled therewith. The one or more PCB 104 can have one or more component receiving modules 106 coupled therewith. Each component receiving module 106 is configured to receive a component 108 therein. The component 108 can have a latch assembly 200 coupled therewith to assist in coupling and decoupling the component 108 with the component receiving module 106.

The server chassis 100 can have a sidewall 110. In at least one embodiment, the sidewall 110 can be adjacent to at least one component receiving module 106 to assist engagement of the latch assembly 200 and the server chassis 100. In other embodiments, the component receiving module 106 can be adjacent to a partial divider, or a combination thereof.

The latch assembly 200 can be transitionable between a latched position and an unlatched position. In the latched position, the pin 206 is secured in the receiving portion 204 of the latch slide 202. The component 108 is secured within the server chassis 100 and coupled with the component receiving module 106. In the unlatched position, the pin 206 is unsecured or removed from the receiving portion 204 of the latch slide 202. The latch assembly 200 is in an unsecured position with the component 108 is decoupled from the component receiving module 106, or in the process of being decoupled from the component receiving module 106.

The server chassis 100 can also have other related components including, but not limited to, fans, storage devices, power supplies, network cards and graphics processing units. The related components are coupled with the server chassis 100 and can implement a latch assembly 200 in accordance with the present disclosure.

Figure 2:
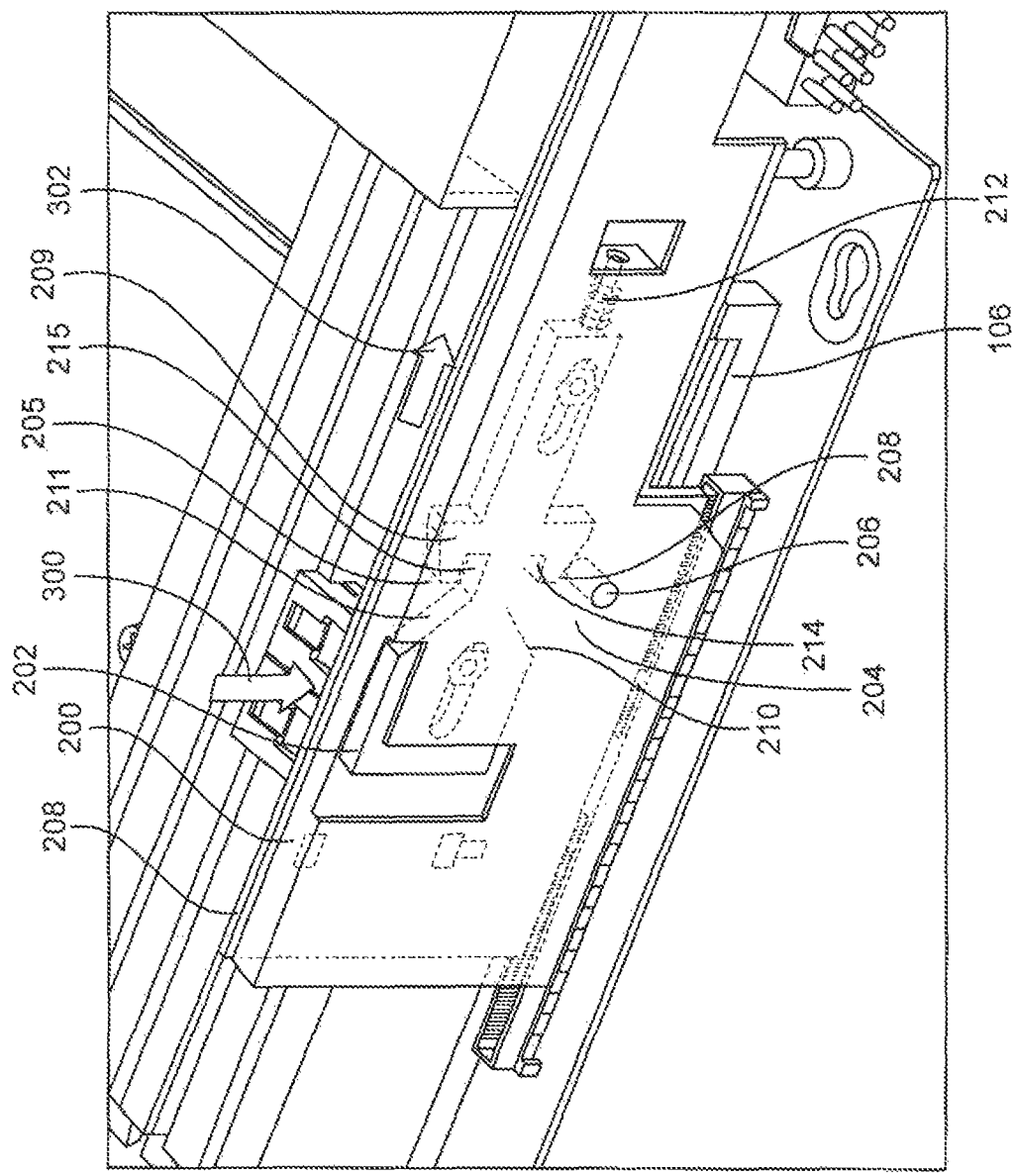
FIG. 2 illustrates a detailed isometric view of an example embodiment of a latch assembly in an unlatched position and coupling a component with a component receiving module.

FIG. 2 illustrates a detailed view of a component having a latch assembly being coupled to a component receiving module 106. The latch assembly 200 can include a latch slide 202 configured to couple the component 108 with the server chassis 100. The latch slide 202 is can have a receiving portion 204. The receiving portion 204 is configured to receive a pin 206 therein.

The latch slide 202 has a latch ramp 208 disposed on one side of the receiving portion 204 and a release ramp 210 disposed on the opposing side of the receiving portion 204. The latch ramp 208 is shaped to draw the pin 206 into the receiving portion 204 and the release ramp 210 is shaped to draw the pin 206 away from the receiving portion 204.

In the illustrated embodiment, the latch slide 202 is coupled with the component receiving module 106 and the pin is coupled with the server chassis 100. The latch ramp 208 and release ramp 210 are angled surfaces forming a substantially V-shape and configured to allow the pin 206 to slide into and away from the receiving portion 204. The latch ramp 208 has a substantially negatively sloped angled surface and the release ramp 210 has a substantially positively sloped angled surface. In other embodiments, the latch ramp 208 and the release ramp 210 can be curved, arc, or any shape configured to guide the pin 206.

As can be appreciated in FIG. 2, the latch slide 202 can have a second receiving portion 205. The second receiving portion 205 can be substantially a mirror image of receiving portion 204 along the longitudinal axis. The second receiving portion 205 can have a second latch ramp 209 and a second release ramp 211. The slope of the second latch ramp 209 and release ramp 211 can be substantially inverse of the latch ramp 208 and release ramp 210, such that second latch ramp 211 has a substantially positive slope and second release ramp 211 has a substantially negative slope. The second receiving portion 205, and related second latch ramp 209 and release ramp 211 are utilized in embodiments where the latch slide 202 is coupled with the server chassis 100 and the pin 206 is coupled with the component receiving module 106.

The latch slide 202 has a biasing element 212 configured to bias the latch slide 202 in the latched position. The biasing element 212 assists in transitioning the latch slide 202 between the latched and unlatched positions and securing the component 108 in the component receiving module 106. The biasing element 212 can be disposed anywhere within the latch assembly 200 so as to bias the latch slide in pin 206 away from the release ramp 210.

The latch slide 202 can include a securing portion 214 opposite the receiving portion 204 and adjacent to the latch ramp 208. The biasing element 212 configured to slide the latch side 202 such that the pin 206 is received in the securing portion 214 when the latch slide 202 is in the latched position. In the illustrated embodiment, the securing portion 214 and latch ramp 208 form a substantially hooked shaped downwardly extending protrusion.

Figure 3:
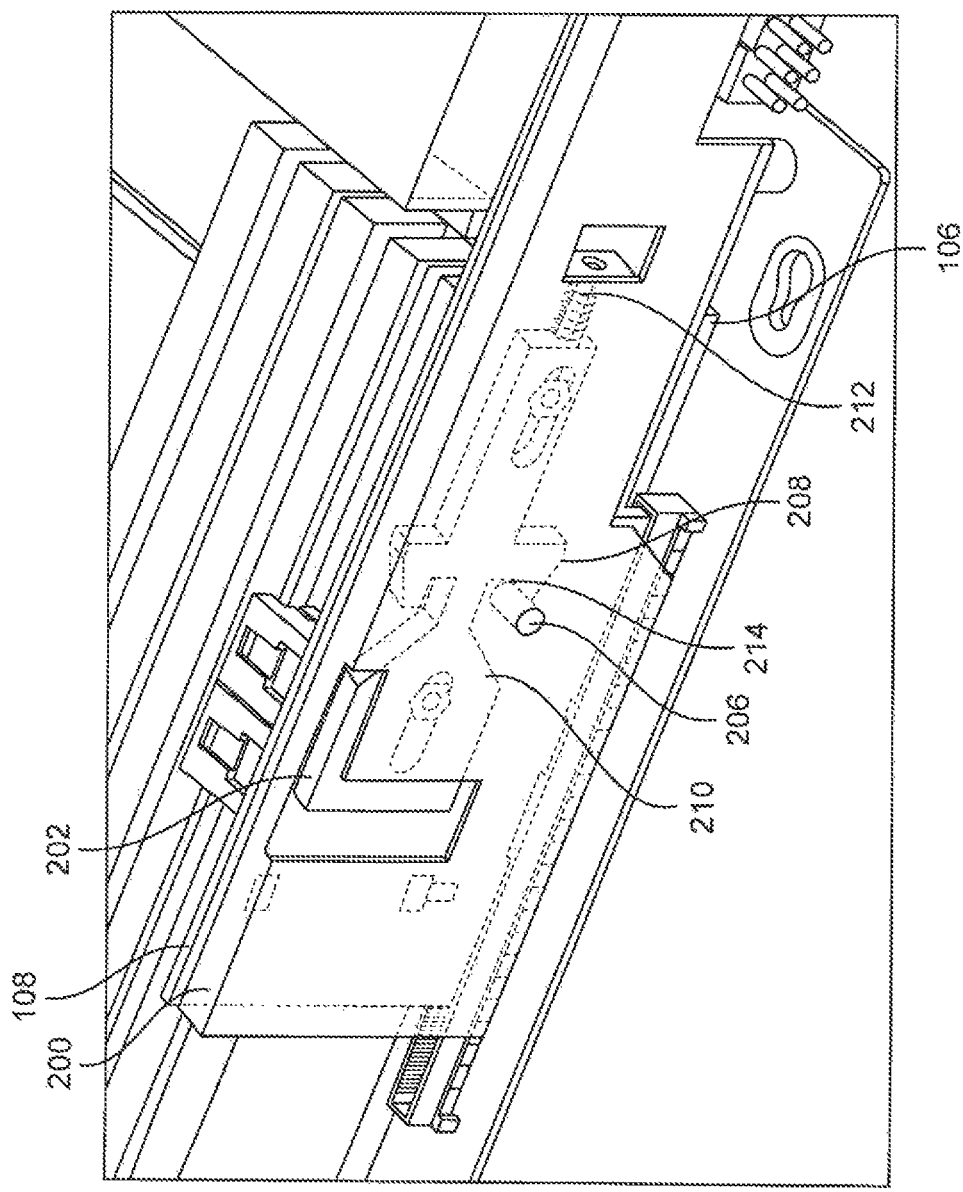
FIG. 3 illustrates a detailed isometric view of an example embodiment of a latch assembly in a latched position.

FIG. 3 illustrates an example embodiment of a latch assembly in a latched position. As can be appreciated in the FIGS. 2 and 3, the component 108 is coupled with the component receiving module 106 by generating a coupling force 300 applied by a user or technician. The force 300 causes the component 108 to be received into the component receiving module 106 and displaces the latch slide 202 in a first direction 302 as the pin 206 engages the latch ramp 208 thus compressing the biasing element 212. When the component 108 couples the component receiving module 106, the pin 206 reaches the end of the latch ramp 208, the biasing element 212 is released, thereby sliding the latch slide 202 in a second direction 304 and into a latched position as the pin 206 is received in the securing portion 214. In at least one embodiment, the second direction 304 can be substantially perpendicular to the first direction 302.

Figure 4:
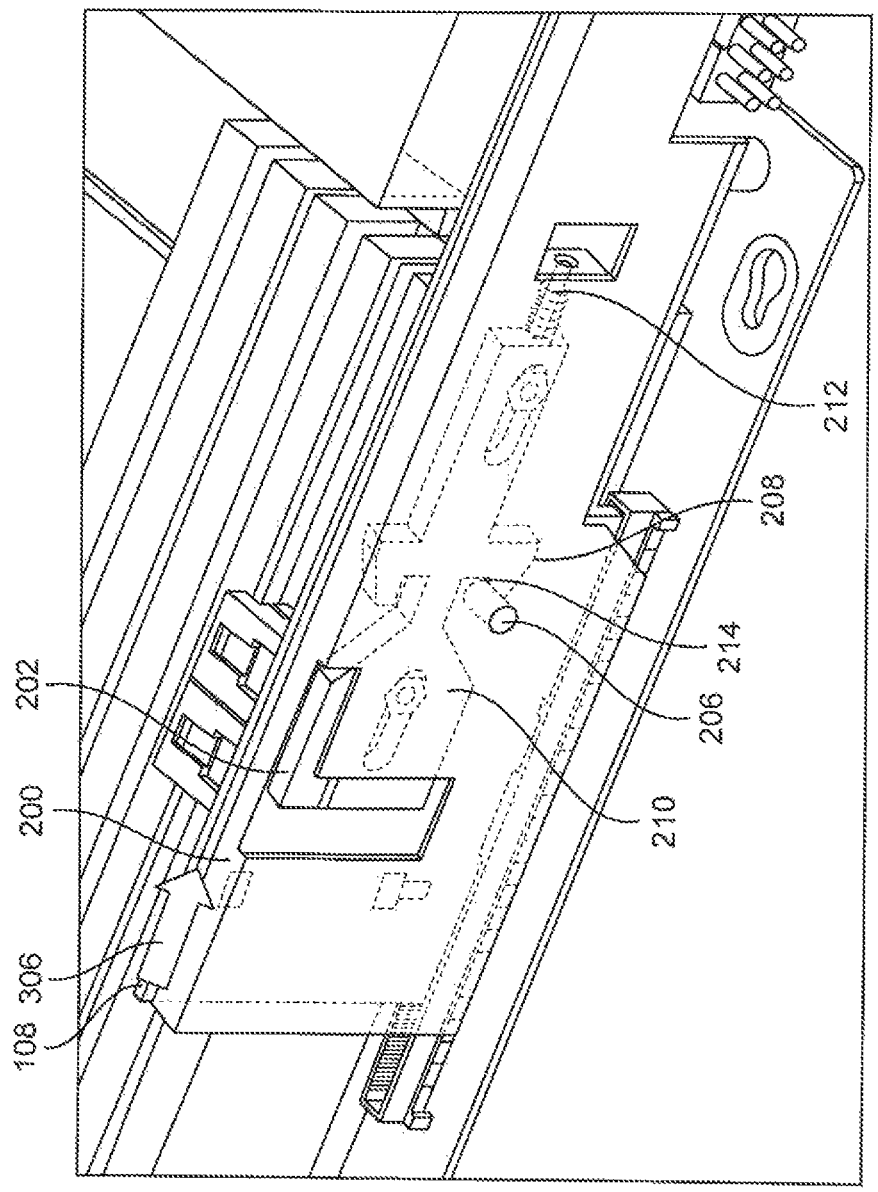
FIG. 4 illustrates a detailed isometric view of an example embodiment of a latch assembly in a partially latched position.

FIG. 4 illustrates an example embodiment of a latch assembly 200 in a partially latched position. The latch slide 202 is displaced in the first direction 302 by the application of a delatching force 306, such that the biasing element 212 compresses and the pin 206 is removed from the securing portion 214. The displacement of the latch slide 202 causes the pin 206 to engage the release ramp 210.

Figure 5:
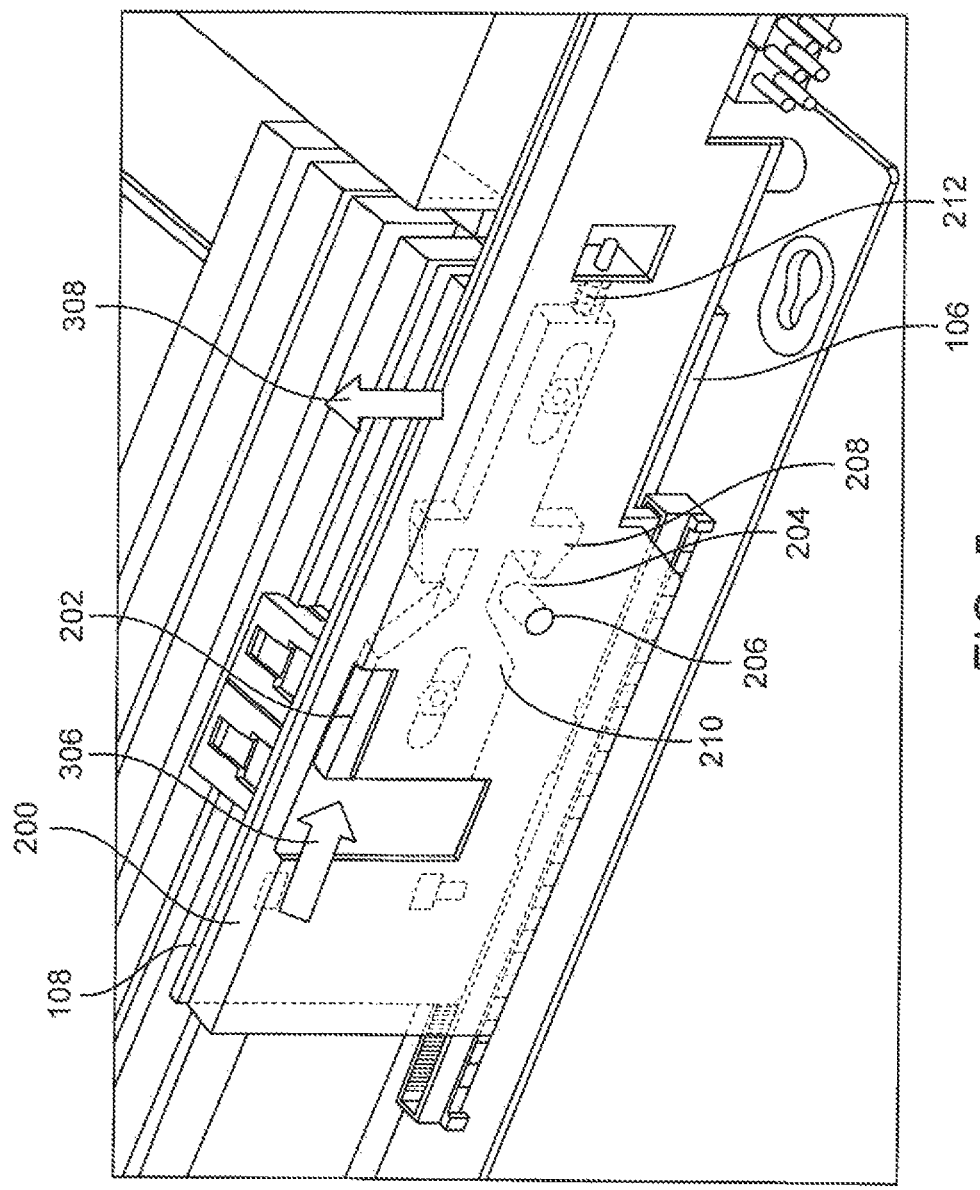
FIG. 5 illustrates a detailed isometric view of an example embodiment of a latch assembly in an unlatched position and decoupling a component from a component receiving module.

FIG. 5 illustrates an example embodiment of a latch assembly 200 in an unlatched position. As the latch slide 202 is displaced in the first direction 302 and the biasing element 212 is compressed by the delatching force 306, the pin 206 travels along the release ramp 210 away from the receiving portion 204, thereby decoupling the component 108 from the component receiving module 106. The movement of the pin 206 along the release ramp 210 causes the urges the component in a decoupling direction 308 substantially perpendicular to the coupling force 300 and away from the component receiving module 106.

In the illustrated embodiment, the release ramp 210 has an angled surface with a positive slope. In other embodiments, the release ramp 210 can be a curved surface, rounded surface, sloped surface, or any surface configured to guide the pin 206 away from the receiving portion 204 thereby decoupling the component 108 from the component receiving module 106.

Figure 6:
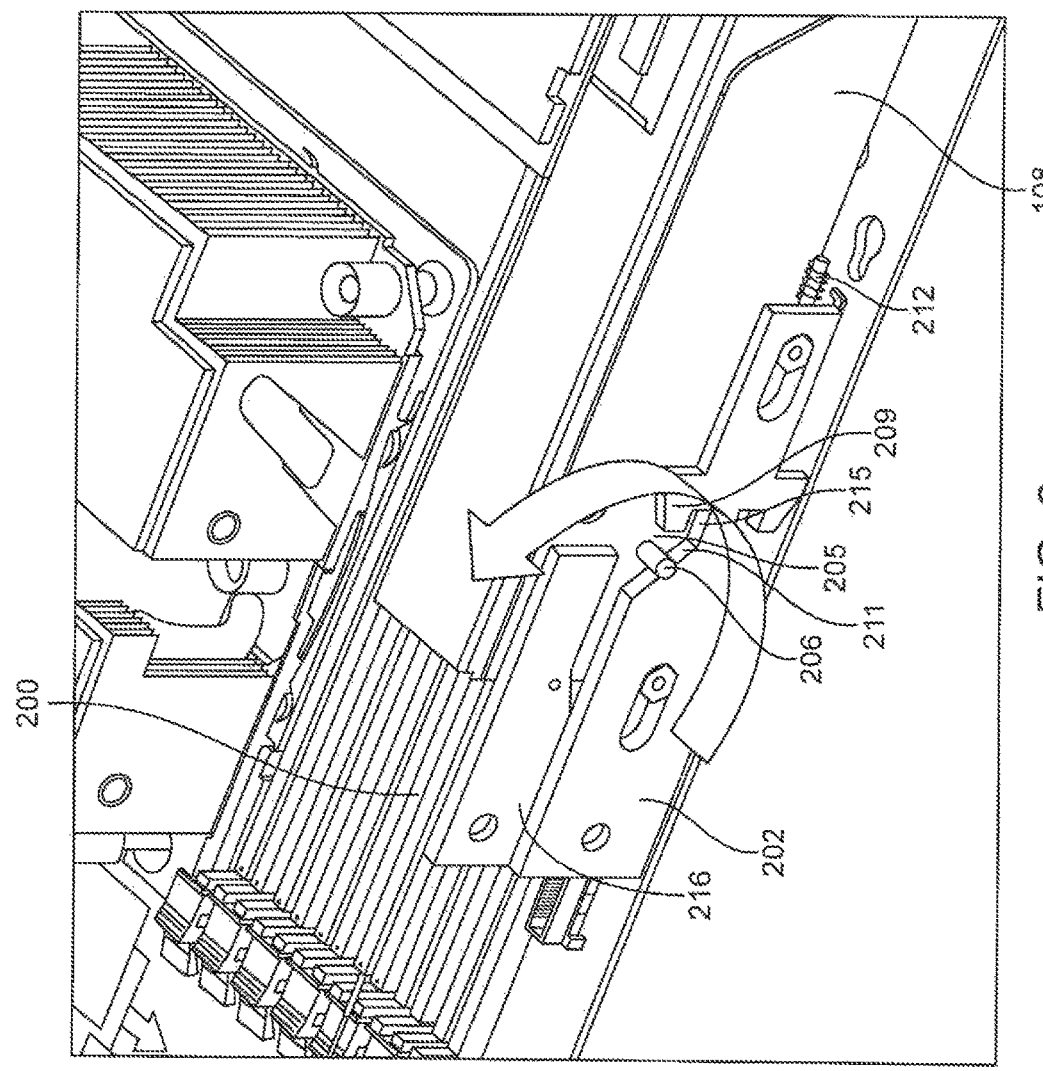
FIG. 6 illustrates a detailed isometric view of a second example embodiment of a latch assembly in an unlatched position having a latch arrangement.

FIG. 6 illustrates an example embodiment of a latch assembly 200 having a lever arrangement 216. The latch slide 202 is coupled with a lever arrangement 216 configured to actuate the latch slide 202 between the latched and unlatched position. The lever arrangement 216 can translate the latch slide 202 thereby compressing the biasing element 212 when actuating the latch slide 202 between the latched and unlatched position.

As can be appreciated in FIG. 6, the latch slide 202 is disposed on the sidewall 110 of the server chassis 100 and the pin 206 is disposed on the component 108. In this arrangement, the latch ramp 209 has a position slope and the release ramp 211 has a negative slope and the pin 206 travels down the latch ramp 209 and up the release ramp 211. The receiving portion 205 is on an upper portion of the latch slide 202, and receives the pin 206 in a downward direction as the pin 206 travels down the latch ramp 209 compressing the biasing element 212 in the first direction 302 and coupling the component 108 with the component receiving module 106. When the component 108 is coupled with the component receiving module 106, the pin 206 is receiving in securing portion 215. In the illustrated embodiment, the latch ramp 209 and the receiving portion 215 form a substantially hooked shaped upwardly extending protrusion.

While the lever arrangement 216 is described in relation to the latch slide 202 disposed on the sever chassis 100 and the pin 206 disposed on the component 108, it is within this disclosure for the latch slide 202 to be disposed on the component 108 and the pin 206 to be disposed on the server chassis 100.

Figure 7:
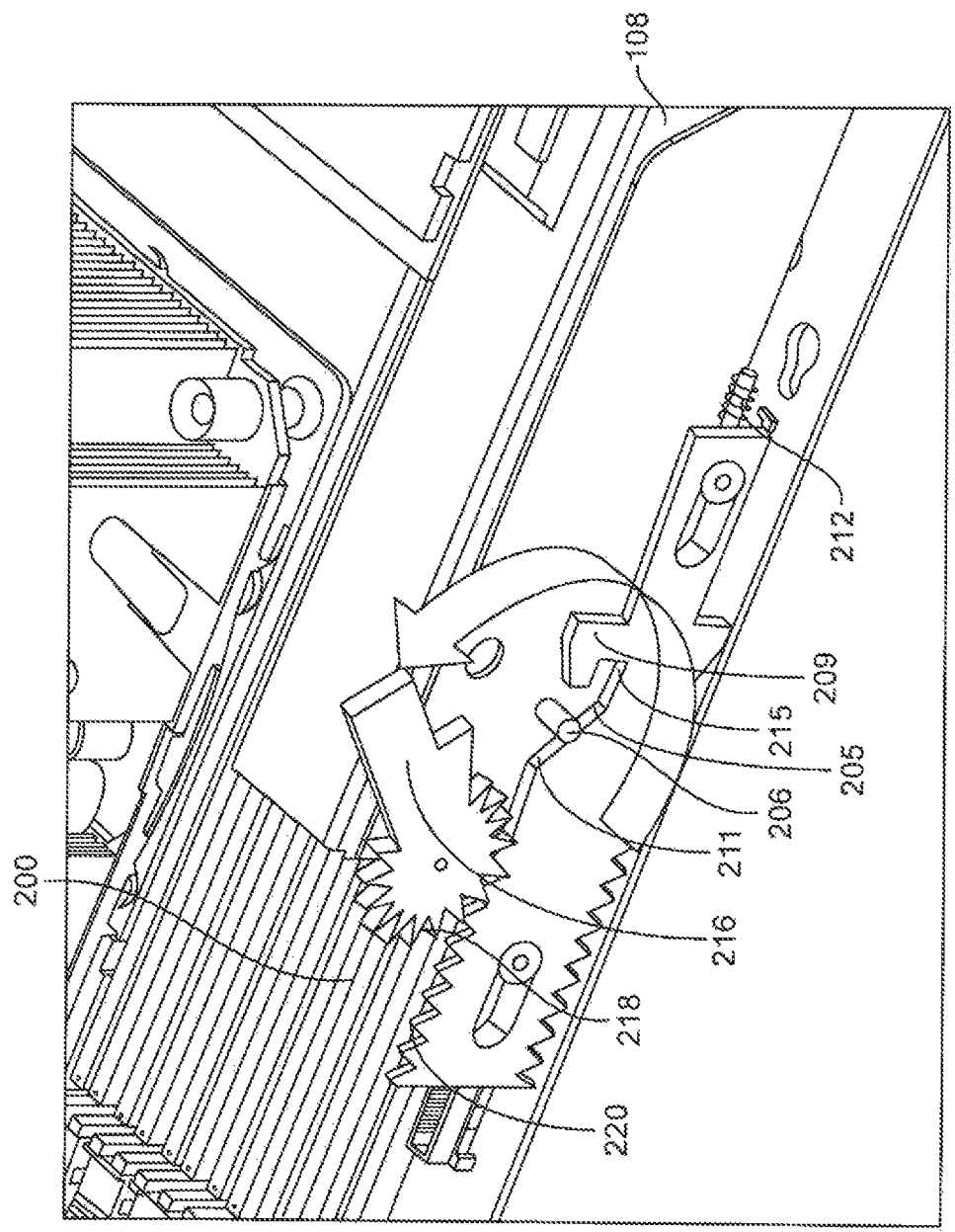
FIG. 7 illustrates a detailed isometric view of a third example embodiment of a latch assembly in an unlatched position having a latch with a gear arrangement.

FIG. 7 illustrates an example second embodiment of a latch assembly 200 having a lever arrangement 216. The lever arrangement 216 can include a gear arrangement 218 configured to engage a corresponding gear arrangement 220 disposed on the latch slide 202. As the lever arrangement 216 is actuated to transition the latch slide 202 between the latched and unlatched position, the gear arrangement 218 engages the corresponding gear arrangement 220, thereby translating the latch slide 202 in the first and second direction 302, 304. As the lever arrangement 216 transitions from the latched position to the unlatched position, the latch slide 202 translates in the first direction 302, thereby compressing the biasing element 212. As the lever arrangement 216 transitions from the unlatched position to the latched position, the latch slide 202 translates in the second direction 304, thereby decompressing the biasing element 212.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A latch mechanism comprising:
   a latch slide configured to couple a component with a server chassis, the latch slide transitionable between a latched position and an unlatched position, the latch slide having a receiving portion configured to receive a pin;
   a latch ramp disposed on the latch slide at a first end of the receiving portion;
   a release ramp disposed on the latch slide at a second end of the receiving portion; and
   a biasing element configured to bias the latch slide in the latched position;
   wherein the latch ramp is configured to draw the pin into the receiving portion and the release ramp is configured to draw the pin away from the receiving portion;
   wherein when the latch slide transitions from the unlatched position to the latched position, the latch slide receives the pin in the receiving portion and the pin engages the latch ramp thereby sliding the latch slide and compressing the biasing element;
   wherein when the latch slide transitions from the latched position to the unlatched position, the biasing member is compressed and the pin engages the release ramp translating the component in a vertical direction.

2. The latch mechanism of claim 1, wherein the latch ramp and the release ramp are angled surfaces.

3. The latch mechanism of claim 1, wherein the latch ramp and the release ramp are curved surfaces.

4. The latch mechanism of claim 1, wherein the latch slide has a securing portion opposite the receiving portion and adjacent to the latch ramp and the biasing element configured to slide the latch slide such that the pin is received in the securing portion.

5. The latch mechanism of claim 1, further comprising a lever transitionable from an open position to a closed position, the lever configured to compress the biasing element and transition the latch slide from the latched position to the unlatched position.

6. The latch mechanism of claim 5, wherein the lever has a set of gear teeth configured to engage a set of corresponding gear teeth disposed on the latch slide as the lever transitions between the open position and the closed position.

7. The latch mechanism of claim 1, wherein the latch slide is coupled with a component and the pin is coupled with a server chassis.

8. The latch mechanism of claim 1, wherein the latch slide is coupled with a server chassis and the pin is coupled with the component.

9. A latch mechanism assembly configured for locking and releasing a component from a component receiving module, the latch mechanism comprising:
   a latch slide transitionable between a latched position and an unlatched position, the latch slide having a receiving portion configured to receive a pin;
   a latch ramp disposed on the latch slide at a first end of the receiving portion;
   a release ramp disposed on the latch slide at a second end of the receiving portion; and
   a biasing element configured to bias the latch slide in the latched position;
   wherein the latch ramp is configured to draw the pin into the receiving portion and the release ramp is configured to draw the pin away from the receiving portion;
   wherein when the latch slide transitions from the unlatched position to the latched position, the pin is received in the receiving portion pin engages the latch ramp thereby sliding the latch slide and compressing the biasing element;

wherein when the latch slide transitions from the latched position to the unlatched position, the biasing member is compressed causing the pin to engage the release ramp and translate the component in a vertical direction.

10. The latch mechanism assembly of claim 9, wherein the latch ramp and the release ramp are angled surfaces.

11. The latch mechanism assembly of claim 9, wherein the latch ramp and the release ramp are curved surfaces.

12. The latch mechanism assembly of claim 9, wherein the latch slide has a securing portion opposite the receiving portion and adjacent to the latch ramp and the biasing element configured to slide the latch slide such that the pin is received in the securing portion.

13. The latch mechanism assembly of claim 9, further comprising a lever transitionable from an open position to a closed position, the lever configured to compress the biasing element and transition the latch slide from the latched position to the unlatched position.

14. The latch mechanism assembly of claim 13, wherein the lever has a set of gear teeth configured to engage a set of corresponding gear teeth disposed on the latch slide as the lever transitions between the open position and the closed position.

15. The latch mechanism assembly of claim 9, wherein the latch slide is coupled with a component and the pin is coupled with a server chassis.

16. The latch mechanism assembly of claim 9, wherein the latch slide is coupled with a server chassis and the pin is coupled with the component.

* * * * *